(12) United States Patent
Kim et al.

(10) Patent No.: US 10,073,145 B2
(45) Date of Patent: Sep. 11, 2018

(54) METHOD AND SYSTEM FOR ESTIMATING STATE OF CHARGE OF BATTERY

(71) Applicant: LG CHEM, LTD., Seoul (KR)

(72) Inventors: Kyung Jik Kim, Daejeon (KR); Ho Sang Kwon, Daejeon (KR); Jae Chan Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 110 days.

(21) Appl. No.: 14/764,434

(22) PCT Filed: Jul. 4, 2013

(86) PCT No.: PCT/KR2013/005932
§ 371 (c)(1),
(2) Date: Jul. 29, 2015

(87) PCT Pub. No.: WO2015/002334
PCT Pub. Date: Jan. 8, 2015

(65) Prior Publication Data
US 2016/0109522 A1    Apr. 21, 2016

(51) Int. Cl.
*G01R 31/36*     (2006.01)
*H01M 10/48*     (2006.01)
*H01M 10/42*     (2006.01)

(52) U.S. Cl.
CPC ....... *G01R 31/3624* (2013.01); *G01R 31/361* (2013.01); *G01R 31/3648* (2013.01);
(Continued)

(58) Field of Classification Search
CPC . G11C 16/0466; G11C 16/0483; G11C 16/06; G11C 16/08; G11C 16/10;
(Continued)

(56) References Cited

U.S. PATENT DOCUMENTS 5,539,318 A    7/1996  Sasaki
2002/0105303 A1    8/2002  Kishi et al.
(Continued)

FOREIGN PATENT DOCUMENTS

EP    1450173 A2    8/2004
JP    6-242193 A    9/1994
(Continued)

OTHER PUBLICATIONS

International Search Report, issued in PCT/KR2013/005932, dated Apr. 15, 2014.

*Primary Examiner* — Tan T Nguyen
(74) *Attorney, Agent, or Firm* — Birch, Stewart, Kolasch & Birch, LLP

(57) ABSTRACT

Disclosed is a method for estimating a state of charge (SOC) of a secondary battery using a full charge capacity (FCC) of the battery, the method including (S1) measuring voltage and current of the battery, (S2) calculating the FCC using a voltage change and a current integral of the battery during a specific time, (S3) estimating a time remaining until the battery is fully discharged using the calculated FCC and the measured voltage and current to calculate a self-discharge rate, (S4) calculating a capacity deterioration rate of each charge cycle of the battery, and (S5) applying the calculated self-discharge rate and the calculated capacity deterioration rate to estimate the SOC of the battery.

6 Claims, 3 Drawing Sheets

(52) U.S. Cl.
CPC ..... *G01R 31/3658* (2013.01); *G01R 31/3675* (2013.01); *G01R 31/3679* (2013.01); *H01M 10/425* (2013.01); *H01M 10/48* (2013.01)

(58) Field of Classification Search
CPC ......... G11C 16/12; G11C 16/14; G11C 16/24; G11C 16/26; G11C 16/28; G11C 16/349; G11C 16/3427; G11C 16/30; H01L 23/528; H01L 27/11568; H01L 11/573; H01L 11/582
USPC ............ 365/185.02, 185.17, 185.18, 185.23, 365/185.28; 700/63; 702/63
See application file for complete search history.

(56) References Cited

U.S. PATENT DOCUMENTS

| | | | |
|---|---|---|---|
| 2003/0057918 A1 | 3/2003 | Aoki et al. | |
| 2004/0008031 A1 | 1/2004 | Arai et al. | |
| 2005/0001625 A1 | 1/2005 | Ashtiani et al. | |
| 2006/0181245 A1 | 8/2006 | Mizuno et al. | |
| 2008/0120049 A1* | 5/2008 | Okumura | G01R 31/3651 702/63 |
| 2012/0105014 A1 | 5/2012 | Nakayama et al. | |
| 2012/0265397 A1 | 10/2012 | Aliberti et al. | |
| 2012/0306450 A1* | 12/2012 | Nakayama | G06F 1/263 320/134 |
| 2013/0311119 A1 | 11/2013 | Tamezane | |
| 2013/0320989 A1 | 12/2013 | Inoue et al. | |
| 2015/0153424 A1* | 6/2015 | Kanada | G01R 31/3679 324/430 |
| 2015/0177331 A1* | 6/2015 | Nakayama | G06F 1/263 702/63 |

FOREIGN PATENT DOCUMENTS

| | | |
|---|---|---|
| JP | 7-176334 A | 7/1995 |
| JP | 2000-285968 A | 10/2000 |
| JP | 2002-298925 A | 10/2002 |
| JP | 2004-14205 A | 1/2004 |
| JP | 2004-354050 A | 12/2004 |
| JP | 2005-83970 A | 3/2005 |
| JP | 2009-244088 A | 10/2009 |
| JP | 2011-106953 A | 6/2011 |
| JP | 2011-142036 A | 7/2011 |
| JP | 2012-88157 A | 5/2012 |
| KR | 10-2007-0105014 A | 10/2007 |
| KR | 10-0880717 B1 | 2/2009 |
| WO | WO 2012/105492 A1 | 8/2004 |
| WO | WO 2012/120620 A1 | 9/2012 |

* cited by examiner

[FIG. 1]
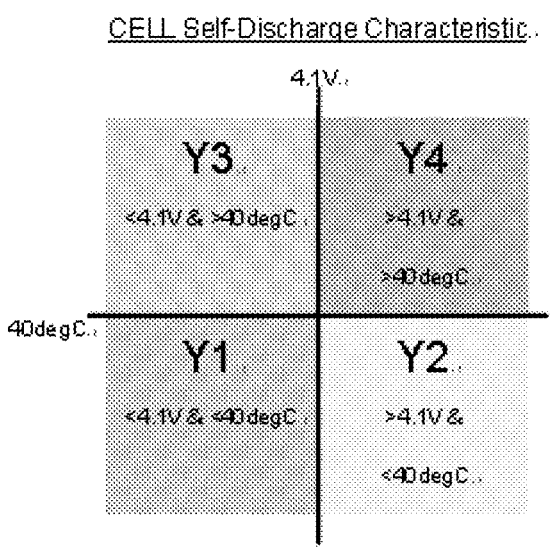
[FIG. 2]
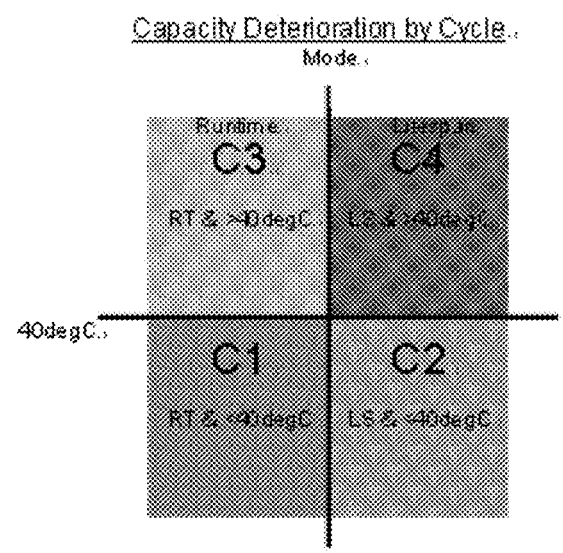

【FIG. 3】
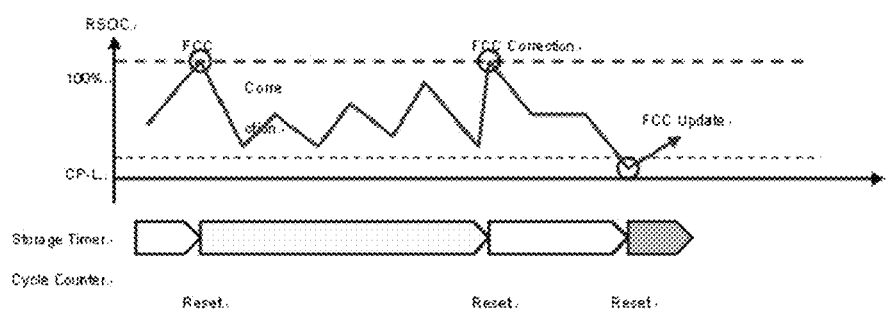
【FIG. 4】
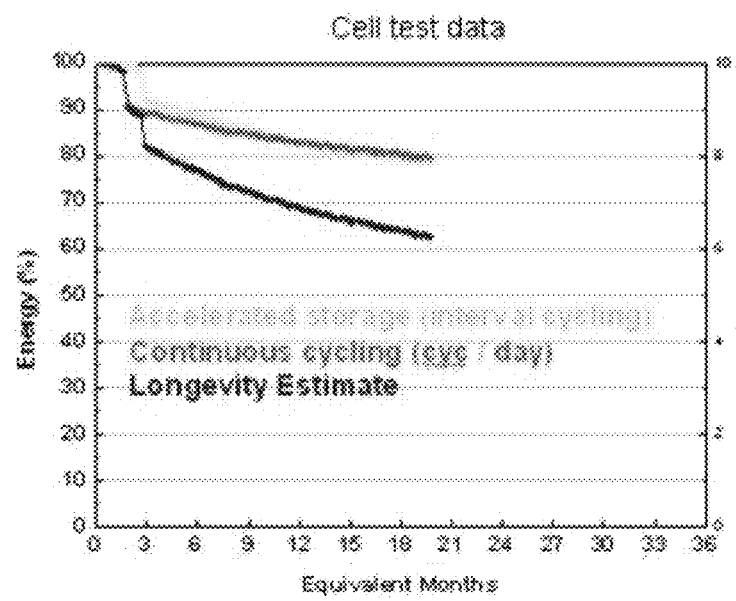

[FIG. 5]
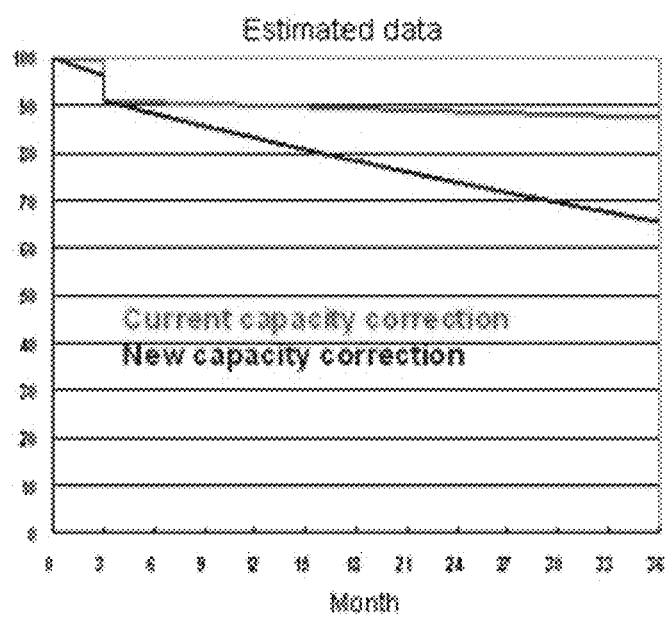

METHOD AND SYSTEM FOR ESTIMATING STATE OF CHARGE OF BATTERY

TECHNICAL FIELD

The present invention relates to a method and system for estimating a state of charge (SOC) of a battery and, more particularly, to a method for estimating a state of charge (SOC) of a secondary battery using a full charge capacity (FCC) of the battery, the method including measuring voltage and current of the battery, calculating the FCC using a voltage change and a current integral of the battery during a specific time, estimating a time remaining until the battery is fully discharged using the calculated FCC and the measured voltage and current to calculate a self-discharge rate, calculating a capacity deterioration rate of each charge cycle of the battery, and correcting the FCC using the calculated self-discharge rate and the calculated capacity deterioration rate to estimate the SOC of the battery.

BACKGROUND ART

Recently, secondary batteries, which can be charged and discharged, have been widely used as energy sources for wireless mobile devices, auxiliary power devices or the like. Secondary batteries have also attracted considerable attention as power sources for electric vehicles (EV), hybrid electric vehicles (HEV), plug-in hybrid electric vehicles (plug-in HEV) or the like which have been developed to solve problems, such as air pollution, caused by existing gasoline and diesel vehicles that use fossil fuels.

Since secondary batteries are used in a variety of mobile or portable devices and the usable time thereof is limited, it is very important to determine correct information regarding the SOC of the secondary battery. The SOC is very important information for the user to use the devices since the SOC serves as a measure of how long the secondary battery can be used. Devices such as a laptop, a mobile phone or a vehicle, in which a secondary battery is typically mounted, estimate the SOC of the secondary battery, determine information such as the usable time or capacity of the secondary battery from the estimated SOC, and provide the determined information to the user.

The SOC of a secondary battery is generally expressed as a percentage of remaining capacity relative to the full charge capacity (FCC) of the secondary battery. Various methods may be used to estimate the SOC of the secondary battery and one typical method is to estimate the SOC using current integration. In the current integration method, input/output current of a secondary battery is integrated and the SOC of the battery is determined by subtracting the integral from the initial capacity.

Although the current integration method derives a relatively accurate SOC value in initial cycles, the accuracy of the current integration method may decrease as the charge cycle count of the secondary battery increases due to the occurrence of an SOC drop phenomenon in which the SOC is rapidly lowered near the end of discharge. Thus, the longer the secondary battery is used, the more rapidly the SOC drops near the end of discharge. If the current integration method is directly used in such situations, it is not possible to correctly estimate the SOC near the end of discharge due to the SOC drop phenomenon. As a result, although the SOC has been more rapidly decreased than expected, reducing the usable time of the secondary battery, the user may be unaware of the reduced usable time and fail to properly cope with the full discharge state of the secondary battery. This greatly inconveniences the user.

Thus, there is a great need to provide a method and system for estimating the remaining capacity (SOC) of a secondary battery, which can fundamentally solve such problems.

DISCLOSURE

Technical Problem

Therefore, the present invention has been made to solve the above and other technical problems that have yet to be resolved.

As a result of intensive studies and various experiments, the present inventors have developed a battery SOC estimation method and system in which a remaining capacity (SOC) of a secondary battery is updated by additionally calculating a capacity deterioration rate of the battery in order to accurately measure the SOC of the battery as described later. The present invention has been completed based on this development.

Therefore, it is an object of the present invention to provide a battery SOC estimation method and system, wherein the SOC of a secondary battery can be corrected by multiplying the SOC by a capacity deterioration rate even when the SOC has rapidly dropped near the end of discharge of the secondary battery, such that accurate estimation of the SOC of the battery is possible, thus providing accurate SOC information to the user.

Technical Solution

In accordance with the present invention, the above and other objects can be accomplished by the provision of a method for estimating a state of charge (SOC) of a secondary battery using a full charge capacity (FCC) of the battery, the method including (S1) measuring voltage and current of the battery, (S2) calculating the FCC using a voltage change and a current integral of the battery during a specific time, (S3) estimating a time remaining until the battery is fully discharged using the calculated FCC and the measured voltage and current to calculate a self-discharge rate, (S4) calculating a capacity deterioration rate of each charge cycle of the battery, and (S5) correcting the FCC using the calculated self-discharge rate and the calculated capacity deterioration rate to estimate the SOC of the battery.

According to the present invention, during the specific time (i.e., during the period of time in which the battery is discharged after being charged), the self-discharge rate is corrected and the capacity deterioration rate is updated to estimate an FCC of the battery, thereby estimating a correct SOC of the battery.

In a preferred example, steps S2 to S5 are performed via a battery management system (BMS).

More preferably, step S5 includes correcting the FCC according to the following expression:

FCC (NEW)=(Calculated FCC)*(Cell self-discharge Rate)*(Capacity Deterioration by Cycle Rate), where Cell self-discharge Rate and Capacity Deterioration by Cycle Rate represent the self-discharge rate and the capacity deterioration rate, respectively.

The self-discharge rate may be calculated according to the following expression:

Self-discharge Rate=1−($Y1*t\_y1+Y2*t\_y2+Y3*t\_y3+Y4*t\_y4$)*(Number of parallel cells/Design Capacity).

In this expression, Y1, Y2, Y3 and Y4 denote respective self-discharge rate values of four state areas, into which states of the battery are divided based upon a specific voltage and a specific temperature, and t_y1, t_y2, t_y3 and t_y4 denote respective discharge times in the four state areas (also referred to as "Y1, Y2, Y3 and Y4 state areas"). Here, the self-discharge rate values Y1, Y2, Y3 and Y4 may be set with reference to the specific voltage and the specific temperature. For example, the specific voltage and the specific temperature may be determined within a range of 3.8 V to 4.5 V and a range of 30° C. to 50° C., respectively. An example, in which the specific voltage and the specific temperature are set to 4.1 V and 40° C., is shown in FIG. 1.

The capacity deterioration rate (Capacity Deterioration by Cycle Rate) may be calculated according to the following expression:

Capacity Deterioration Rate=1−($C1$*cycle 1+$C2$*cycle 2+$C3$*cycle 3+$C4$*cycle 4)*(Number of parallel cells/Design Capacity).

In this expression, C1, C2, C3 and C4 denote respective capacity deterioration rate values of four state areas, into which states of the battery are divided based upon a specific period and a specific temperature, and cycle 1, cycle 2, cycle 3 and cycle 4 denote the respective numbers of charge cycles in the four state areas (also referred to as "C1, C2, C3 and C4 state areas"). Here, the capacity deterioration rate values C1, C2, C3 and C4 may be set with reference to the specific period and the specific temperature. For example, the specific period and the specific temperature may be determined within a range of 50 to 150 days and a range of 30° C. to 50° C. An example, in which the specific period and the specific temperature are set to 90 days and 40° C., is shown in FIG. 2.

More preferably, calculation of the capacity deterioration rate includes setting each of the capacity deterioration rate values C1, C2, C3 and C4 after one of the C1 to C4 state areas in which the battery is present is determined when the battery has been charged to 85% or higher. Specifically, calculation of the capacity deterioration rate may include determining one of the C1 to C4 state areas in which the battery is present after the battery is charged to 85% or higher, determining a capacity deterioration rate value corresponding to the determined area, and multiplying the determined capacity deterioration rate value by the number of charge cycles in the determined area.

The FCC may be updated after the battery is fully charged and may be reset immediately after the battery is fully charged, when the battery is initially used, or when the battery has reached a lowest correction point.

The present invention also provides a secondary battery SOC estimation system including the battery SOC estimation method and a secondary battery including the SOC estimation system.

The secondary battery may be a unit battery that includes a single battery cell or may be an assembled battery to which two or more battery cells are assembled. Thus, the secondary battery is not limited to specific terms. The type of the secondary battery is not particularly limited. Preferably, the secondary battery is a lithium secondary battery.

The construction, structure, and manufacture of secondary batteries including lithium secondary batteries are obvious to those skilled in the art and therefore a detailed description thereof is omitted herein.

The secondary battery may be used as a drive source or a power source of a small-scale device such as a mobile phone or a laptop. The secondary battery may also be used as a drive source or a power source of a large-scale device such as an electric vehicle (EV), a hybrid electric vehicle (HEV), a plug-in hybrid electric vehicle (PHEV) or a power storage device.

Such devices are well known in the art and therefore a detailed description thereof is omitted herein.

Advantages

In the battery SOC estimation method and system according to the present invention, even when the SOC of a secondary battery has rapidly dropped near the end of discharge of the secondary battery, the SOC is corrected by calculating a capacity deterioration rate. Accordingly, it is possible to accurately estimate the SOC, thus providing accurate SOC information to the user.

In addition, the capacity of the secondary battery is accurately determined, thereby improving longevity of the battery.

BRIEF DESCRIPTION OF THE DRAWINGS

The above and other objects, features and other advantages of the present invention will be more clearly understood from the following detailed description taken in conjunction with the accompanying drawings, in which:

FIG. 1 is a graph showing self-discharge characteristics of a battery cell according to an embodiment of the present invention;

FIG. 2 is a graph showing capacity degradation of a battery cell of each cycle according to an embodiment of the present invention;

FIG. 3 is a graph showing times at which FCC is reset according to one embodiment of the present invention;

FIG. 4 is a graph showing the amount of stored charge (or energy) in a battery cell according to one embodiment of the present invention; and FIG. 5 is a graph showing an estimation of the amount of stored charge (or energy) in a battery cell according to one embodiment of the present invention.

BEST MODE

Now, embodiments of the present invention will be described in detail with reference to the accompanying drawings. However, it should be noted that the description of the embodiments is given to provide better understanding of the present invention without limiting the scope of the invention.

FIG. 1 is a schematic graph showing self-discharge characteristics of a battery cell according to an embodiment of the present invention and FIG. 2 is a schematic graph showing capacity degradation of a battery cell of each cycle according to an embodiment of the present invention.

Referring to FIGS. 1 and 2, in a battery SOC estimation method and system according to the present invention, a total full charge capacity (FCC) of a battery (or batteries) is calculated when the battery begins to be charged. To correct the FCC as charging and discharging proceeds, a self-discharge rate and a capacity deterioration rate are calculated and a corrected FCC is calculated based on the calculated self-discharge rate and capacity deterioration. A remaining capacity (SOC) of the battery is estimated based on the corrected FCC.

The self-discharge rate of a battery cell is divided into respective self-discharge rate values Y1 to Y4 of four state areas (hereinafter referred to as "Y1 to Y4 state areas") into which states of the battery are divided based upon a deterioration temperature of 40° C. (X axis) and a charged voltage of 4.1 V (Y axis) of the battery cell. A self-discharge rate in which the self-discharge rate values of the Y1 to Y4 state areas are reflected is calculated based on the following Expression 1.

Self-discharge Rate=1($Y1*t\_y1+Y2*t\_y2+Y3*t\_y3+Y4*t\_y4$)*(Number of parallel cells/Design Capacity)           Expression 1

In Expression 1, t denotes discharge time (specifically, $t\_y1$, $t\_y2$, $t\_y3$ and $t\_y4$ denote respective discharge times in the Y1, Y2, Y3 and Y4 state areas) and Y1, Y2, Y3 and Y4 denote respective self-discharge rate values of the Y1, Y2, Y3 and Y4 state areas. During a discharge time t during which discharging proceeds, one of the Y1 to Y4 state areas in which the battery is present is determined with reference to the deterioration temperature of 40° C. and the charge voltage of 4.1 V. A self-discharge rate value corresponding to the determined area is multiplied by the total number of battery cells (i.e., total voltage) relative to the initial design capacity of the battery to calculate the self-discharge rate of the battery.

The capacity deterioration rate of a battery cell is divided into respective capacity deterioration rate values C1 to C4 of four state areas (hereinafter referred to as "C1 to C4 state areas") into which the states of the battery as the battery proceeds through charge/discharge cycles are divided based upon a duration of 90 days (Y axis) and a temperature of 40° C. (X axis). A capacity deterioration rate in which the capacity deterioration rate values of the C1 to C4 state areas are reflected is calculated based on the following Expression 2.

Capacity Deterioration Rate=1−($C1$*cycle 1+$C2$*cycle 2+$C3$*cycle 3+$C4$*cycle 4)*(Number of parallel cells/Design Capacity)           Expression 2

In Expression 2, C1, C2, C3 and C4 denote respective capacity deterioration rate values of the C1, C2, C3 and C4 state areas and cycle 1, cycle 2, cycle 3 and cycle 4 denote the respective numbers of charge cycles in the C1, C2, C3 and C4 state areas. During discharge of the battery, one of the C1 to C4 state areas in which the battery is present is determined with reference to the deterioration temperature of 40° C. and the usage period of 90 days. A capacity deterioration rate value corresponding to the determined area is multiplied by the total number of battery cells (i.e., total voltage) relative to the initial design capacity of the battery to calculate the capacity deterioration rate of the battery. Capacity deterioration values calculated respectively for the C1 to C4 state areas are shown in Table 1 below.

TABLE 1

| Parameter | Unit | Value | Remark |
|---|---|---|---|
| C1 | µAh/CELL | 890 | 0~65353 deterioration capacity/1 cycle in C1 area |
| C2 | µAh/CELL | 550 | 0~65353 deterioration capacity/1 cycle in C2 area |
| C3 | µAh/CELL | 1250 | 0~65353 deterioration capacity/1 cycle in C3 area |
| C4 | µAh/CELL | 850 | 0~65353 deterioration capacity/1 cycle in C4 area |

As can be seen from Table 1, the capacity per cycle of the battery cell is high when the usage period of the battery is short and the temperature is high. That is, as the usage period of the battery increases, heat generation of battery cells increases and therefore the capacity deterioration rate of the battery increases.

FIG. 3 is a schematic graph showing times at which FCC is reset according to one embodiment of the present invention.

As shown in FIG. 3, in the SOC estimation method and system according to the present invention, the FCC of the battery is updated, after the battery is fully charged such that the remaining SOC (RSOC) of the battery has reached 100%, and is reset when the battery is initially used or when the battery has reached the lowest correction point (Correction Point Low). This enables correct estimation of the remaining capacity (SOC) of the battery.

Specifically, the full charge capacity (FCC) of the battery is updated immediately after the battery is initially fully charged. After charging is terminated, the FCC of the battery is initially reset when the battery is initially used. Then, after the battery is recharged, the FCC of the battery is again reset when the battery is fully charged such that the remaining SOC (RSOC) of the battery has reached 100% or when the battery has reached the lowest discharge level such that the RSOC is 6%. Thus, the SOC of the battery is calculated in real time.

FIG. 4 is a schematic graph showing the amount of stored charge (or energy) in a battery cell according to one embodiment of the present invention and FIG. 5 is a schematic graph showing an estimation of the amount of stored charge (or energy) in a battery cell according to one embodiment of the present invention.

Compared to an actually measured battery capacity, the (new) FCC value corrected using the self-discharge rate and the capacity deterioration rate represents a more accurate SOC of the battery. This allows the user to obtain a more accurate SOC to correctly determine the available capacity of the battery in real time.

As is apparent from the above description, the battery SOC estimation method and system according to the present invention have a variety of advantages. Even when the SOC of a secondary battery has rapidly dropped near the end of discharge of the secondary battery, the SOC is corrected by calculating a capacity deterioration rate. Accordingly, it is possible to accurately estimate the SOC, thus providing accurate SOC information to the user.

In addition, the capacity of the secondary battery is accurately determined, thereby improving longevity of the battery.

It will be apparent to those skilled in the art that various modifications and variations are possible in light of the above teaching without departing from the scope of the invention.

The invention claimed is:

1. A method for estimating a state of charge (SOC) of a secondary battery using a full charge capacity (FCC) of the secondary battery, the method comprising:
measuring a voltage and current of the secondary battery, including a voltage change and a current integral of the secondary battery, during a period of time in which secondary battery is discharged after being fully charged, wherein the measuring the voltage and current is performed in each of four state areas into which states of the secondary battery are divided based upon a specific voltage and a specific temperature;
calculating, by a battery management system (BMS), the FCC using the voltage change and the current integral of the secondary battery during the period of time then resetting the FCC when the secondary battery is fully charged, when the secondary battery has reached a lowest discharge level, or when the secondary battery has reached a lowest correction point;

estimating a time remaining until the battery is fully discharged using the calculated FCC and the measured voltage and current to calculate a self-discharge rate according to the following expression:

self-discharge rate=$1-(Y1*t\_y1+Y2*t\_y2+Y3*t\_y3+Y4*t\_y4)*$(number of parallel cells/design capacity), where $Y1$, $Y2$, $Y3$ and $Y4$ denote respective self-discharge rate values of the respective four state areas, $t\_y1$, $t\_y2$, $t\_y3$ and $t\_y4$ denote respective discharge times in the four state areas, and $Y1$, $Y2$, $Y3$ and $Y4$ are set with reference to the specific voltage and the specific temperature;

calculating, by the BMS, a capacity deterioration rate of each charge cycle of the secondary battery according to the following expression:

capacity deterioration rate=$1-(C1*\text{cycle }1+C2*\text{cycle }2+C3*\text{cycle }3+C4*\text{cycle }4)*$(number of parallel cells/design capacity), where $C1$, $C2$, $C3$ and $C4$ denote respective capacity deterioration rate values of four state areas, into which states of the secondary battery are divided based upon a specific period and a specific temperature, cycle 1, cycle 2, cycle 3 and cycle 4 denote the respective numbers of charge cycles in the four state areas, and $C1$, $C2$, $C3$ and $C4$ are set with reference to the specific period and the specific temperature;

correcting, by the BMS, the FCC to be the product of the calculated FCC, the self-discharge rate, and the capacity deterioration rate; and controlling, by the BMS, charging and discharging of the secondary battery based on the SOC estimated by using the calculated self-discharge rate and the calculated capacity deterioration rate.

2. The method according to claim 1, wherein the correcting of the FCC comprises correcting the FCC according to the following expression:

FCC (NEW)=(calculated FCC)*(cell self-discharge rate)*(capacity deterioration by cycle rate), where cell self-discharge rate and capacity deterioration by cycle rate represent the self-discharge rate and the capacity deterioration rate, respectively, of the second battery.

3. The method according to claim 1, wherein the calculating of the capacity deterioration rate comprises setting each of the capacity deterioration rate values of the four state areas after one of the four state areas in which the secondary battery is present is determined when the secondary battery has been charged to 85% or higher.

4. The method according to claim 1, wherein the FCC is updated after the secondary battery is fully charged and is reset immediately after the secondary battery is fully charged, when the secondary battery is initially used, or when the secondary battery has reached a lowest correction point.

5. A secondary battery SOC estimation system for performing the method according to claim 1.

6. The secondary battery comprising the SOC estimation system according to claim 5.

* * * * *